United States Patent

Burkhart et al.

[11] Patent Number: 6,066,901
[45] Date of Patent: May 23, 2000

[54] MODULATOR FOR GENERATING HIGH VOLTAGE PULSES

[75] Inventors: Craig P. Burkhart, Ventura; John R. Bayless, Malibu, both of Calif.

[73] Assignee: First Point Scientific, Inc., Agogra Hills, Calif.

[21] Appl. No.: 09/154,870

[22] Filed: Sep. 17, 1998

[51] Int. Cl.[7] .................................................. H03K 3/00
[52] U.S. Cl. ............................................................. 307/106
[58] Field of Search .................................... 307/106, 108; 342/201; 327/540; 315/209 R, 105, 307, 308; 363/132, 65

[56] References Cited

U.S. PATENT DOCUMENTS

| | | | |
|---|---|---|---|
| 4,682,114 | 7/1987 | Aucouturier et al. .................. | 327/179 |
| 4,684,821 | 8/1987 | Picone et al. ........................... | 307/106 |
| 4,803,378 | 2/1989 | Richardson ............................. | 307/108 |
| 5,038,051 | 8/1991 | Firman et al. .......................... | 307/106 |
| 5,326,970 | 7/1994 | Bayless .................................... | 250/269 |
| 5,594,378 | 1/1997 | Kruse et al. ............................. | 327/304 |
| 5,601,633 | 2/1997 | Ponizovsky et al. ....................... | 95/81 |

OTHER PUBLICATIONS

Smith, Ian Pulsed Power in the United States (No Date) pp. 15–22.
Miller, R. et al., Inductive Adder for Radiographic Applications Proc. of the 1989 Flash Radiography Topical Aug. 1989 pp. 265–278.
Smith, I. et al. Design of a Repetitive +30 MV, 9ns ICF Reactor Driver pp. 36–42, (No Date).
Smith, C. H. Permeabilities of Metallic Glasses at High Magnetization Rates IEEE Conf. Record of 18th Power Modulator Symp. May 1988 pp. 336–339.
Santa maria G. et al. High Power Switching Using Power FET Arrays pp. 161–163, Proc. 6th IEEE Pulsed Power Conf. Jun. 1987.
Kirbie, H. et al. Evolution of High Repetitive–Rate Induction Accelerators Through Advancements in Switching Proc. of the 1992 Linear Accelerator Conf. Aug. 1992 p. 595.
Kirbie, H. et al. A FET Switched Induction Accelerator Cell Proc. of the 9th IEEE Pulsed Conf. Jun. 1993, (No page).

*Primary Examiner*—Jeffrey Gaffin
*Assistant Examiner*—Sharon Polk
*Attorney, Agent, or Firm*—Jack C. Munro

[57] ABSTRACT

A topology for combining an array of low voltage, low current components to form a high voltage, high current pulse modulator. Each module of the MIA is composed of an inductive adder cell and a plurality of energy storage capacitors, a plurality of solid-state switches, and ancillary components to form a high current but a low voltage modulator. By using a large number of energy-storage/switch combinations in parallel, a highly redundant (reliable) module is formed. High voltage is obtained by inductively adding the voltage of a plurality of modules. Each module drives a single turn primary of a transformer (inductive adder cell). Each transformer has a single turn secondary. The single turn secondary of each transformer is connected in series. The advantage to this transformer topology (as opposed to a multi-turn secondary) is greatly reduced secondary capacitance which allows the transformer to operate at much higher bandwidth than otherwise possible.

25 Claims, 3 Drawing Sheets

MODULATOR FOR GENERATING HIGH VOLTAGE PULSES

BACKGROUND OF THE INVENTION

1) Field of the Invention

This invention relates to a new modulator topology that combines solid-state switches in a high voltage, high current array which avoids the difficulties inherent to other array geometries.

2) Description of the Prior Art

This invention was made with the United States Government support under grant number DE-FG03-96ER82172 awarded by the Department of Energy. The Government has certain rights in this invention.

Schemes for producing high voltage pulses are known. For example, U.S. Pat. No. 5,038,051 to Firman et al., describes a Solid State Modulator For Microwave Transmitters. The switching modulator of Firman et al. uses a plurality of individual primary windings coupled to a single secondary winding. The voltage generated in the secondary winding is proportional to the sum of the excitation of the primary windings. Each of the primary windings is individually switchable for regulating the generated output voltage at the secondary winding. However, this prior art modulator is uniquely unipolar (due to the presence of the diodes employed). Bipolar construction is needed to reset the transformer core. Additionally, Firman et al. has no local energy storage capability in each of the modules.

In accordance with U.S. Pat. No. 5,326,970 to Bayless, a Method and Apparatus for Logging Media of a Borehole is disclosed. Like Firman et al., there is no provision for any local energy storage in each module. Further, a single pulse generator is used to energize all of the induction modules. Due to the method used to reset the induction cores, the duty cycle of this device is intrinsically limited. Additionally, the core reset current does not recharge the capacitors. Finally, the primary pulses are high voltage, greatly exceeding the voltage which could be switched with a single solid-state device.

U.S. Pat. No. 5,601,633 to Ponizovsky discloses a High Voltage Electrical Method for removing ecologically noxious substances from gases using a multi-Stage Fitch pulse modulator which produces a high level pulsating voltage superimposed on a constant direct current voltage. The Fitch pulse generator produces a high voltage output pulse by adding the individual stage voltages electrostatically, rather than electromagnetically as in the present invention. Further, the Fitch pulse modulator requires high voltage switches; air spark discharges, vacuum discharges, or gas filled discharge tubes. These are not solid-state devices. Therefore, the Fitch pulse modulator would require more frequent service and incur higher operating costs than the present invention.

SUMMARY OF THE INVENTION

The present invention provides a pulsed power source capable of delivering fast rise time, high voltage, high current, and high repetition rate pulses, and having improved design and functional features over the known prior art.

In accordance with the invention, there is provided a pulse modulator comprising an array of modules. These modules comprise an inductive adder cell and a semiconductor controlled electrical pulse circuit that drives the primary of said adder cell. The modules are joined to form a modulator by connecting in series the secondary windings of the inductive adder cells, which forms the modulator output.

In further aspects of the invention; methods are provided to recharge the electrical pulse circuit(s), reset the magnetic core of the inductive adder cell(s), or simultaneously perform both functions.

In other aspects of the invention, a number of potentially useful designs for the electrical pulse circuit(s) are disclosed. Additionally, methods to control inductance in the secondary and prevent electrical breakdown are provided.

In yet a further aspect of the invention there is provided a pulse modulator comprising a parallel combination of at least two of the pulse modulators as defined above.

In a final aspect of the invention, there is provided a plasma discharge reactor powered by a pulse modulator as defined above.

The Miniature Inductive Adder, hereinafter referred to as MIA, is a general architecture that may be employed in the construction of compact, high voltage (to >100 kV), high current (10 A to >100 kv), high repetition rate (to >1 MHz), high bandwidth (to >10 MHz) and long life (to >$10^{11}$ pulses) pulse modulators based on small solid state devices. The MIA topology can be used with a variety of solid state switching elements and be configured for a broad range of output pulse characteristics. No other pulse modulator concepts offer this attractive combination of characteristics. Therefore, it is expected that the MIA architecture will greatly reduce costs, improve reliability and serve as enabling technology for numerous pulse modulator applications. Promising application areas include modulators for:

1. Plasma discharge devices for air and water pollution control;
2. Pulsed electrostatic precipitators;
3. Recirculating and linear particle accelerators for use in areas including heavy ion fusion, high energy physics studies, radiation processing, and ion implantation;
4. Beam extraction systems (kickers) for circular accelerators and storage rings;
5. Laser systems, including; $CO_2$, excimer, copper vapor, nitrogen and YAG lasers;
6. Plasma ion implantation systems for ion surface modification and semiconductor implantation;
7. High pressure arc lamps and flash lamps;
8. Radar systems; and
9. Pulsed neutron generator systems.

DETAILED DESCRIPTION OF THE PREFERRED EMBODIMENT

Figure 1:
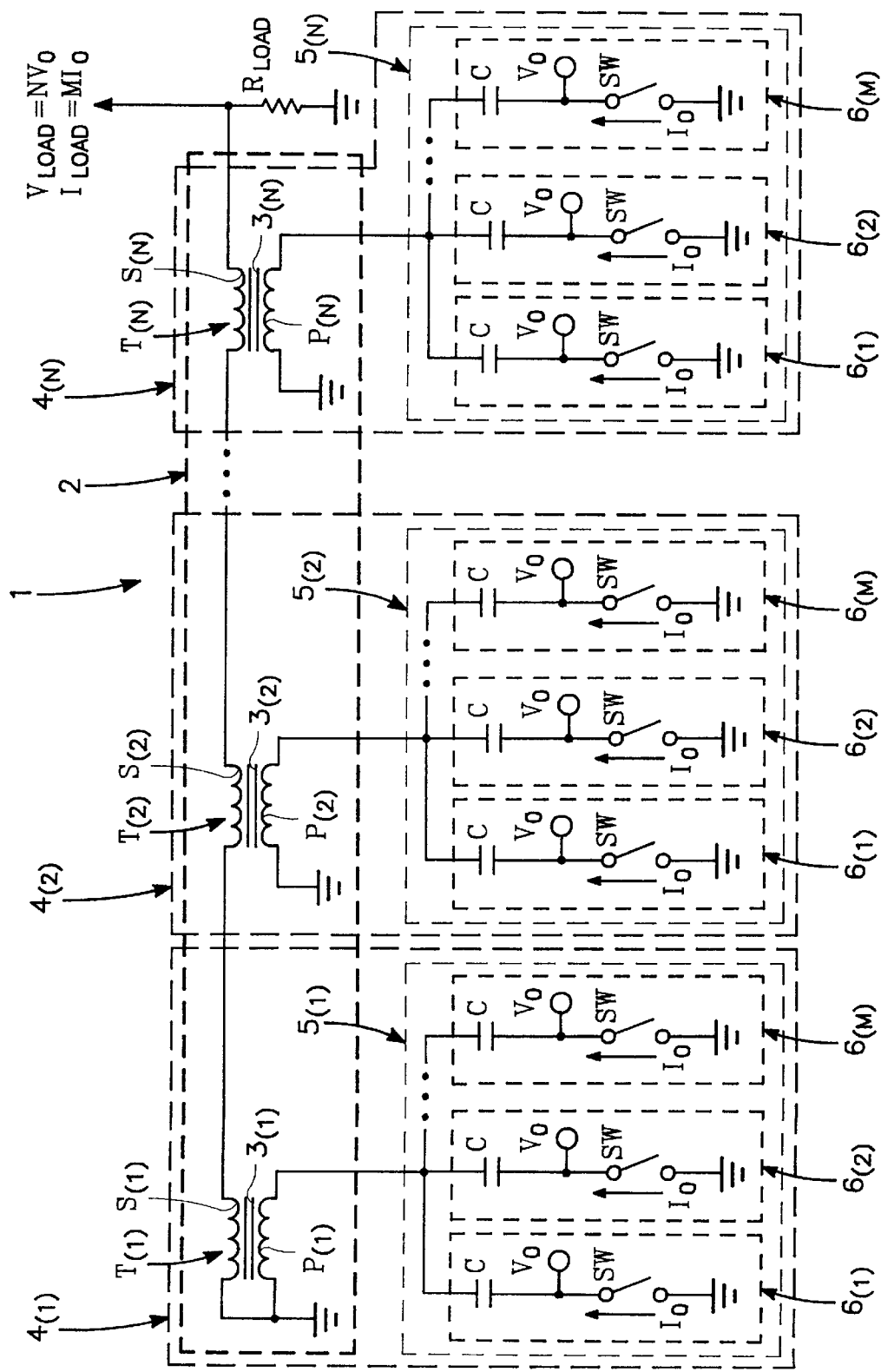
FIG. 1 is a simplified schematic diagram of a miniature inductive adder showing the interconnection of a plurality of inductive adder cells and electrical pulse circuits.

The MIA concept is a general architecture for constructing high voltage, high current modulators from arrays of small solid state devices which avoids the difficulties inherent to other array geometries. The concept of the MIA modulator 1 is illustrated schematically in FIG. 1. The MIA is formed from an N (1 or more) series array of modules. The term "module" is referenced by the numeral 4 and it refers to a combination of an inductive adder cell $T_{(1)}$ for module $4_{(1)}$, $T_{(2)}$ for module $4_{(2)}$, $T_{(n)}$ for module $4_{(n)}$ and a corresponding electrical pulse circuit $5_{(1)}$ for module $4_{(1)}$, $5_{(2)}$ for module $4_{(2)}$ and $5_{(n)}$ for module $4_{(n)}$. Each aforementioned inductive adder cell $T_{(1)}$, $T_{(2)}$ to $T_{(n)}$ is in effect a transformer, consisting of a single turn primary $P_{(1)}$, $P_{(2)}$ to $P_{(n)}$ and a single turn secondary (the stalk) $S_{(1)}$, $S_{(2)}$ to $S_{(n)}$ both of which are wound on a ferro- or ferri-magnetic core $3_{(1)}$, $3_{(2)}$ to $3_{(n)}$. Each of the said electrical pulse circuits include an array (1 or more) of subcircuits $6_{(1)}$, $6_{(2)}$ to $6_{(m)}$ functionally in parallel, which includes energy storage capacitors C controlled by solid-state switches SW, functionally in parallel, as well as connections for power and input signals and trigger conditioning components (described hereinafter). The N modules are combined to form a MIA by connecting, in series, the secondary windings $S_{(1)}$, $S_{(2)}$ to $S_{(n)}$ of all the modules 4.

In operation, after each capacitor C is charged to $V_o$, the switches SW are modulated to initiate the discharge of the capacitors. Full closure of all the switches SW results in the generation of an electrical pulse of voltage $V_o$ by each of the circuits $5_{(1)}$, $5_{(2)}$ to $5_{(n)}$ which is in turn applied to the corresponding primaries $P_{(1)}$, $P_{(2)}$ to $P_{(n)}$ of the inductive adder cells. The resultant output pulse is produced across the stalk $S_{(1)}$, $S_{(2)}$ to $S_{(n)}$. The magnitude of the output voltage is $NV_o$, which with the proper selection of N, may be orders of magnitude greater than the maximum steady state voltage in the system which is $V_o$. Similarly, the current flowing through any switch SW is $I_o$ and the load current is $MI_o$ where M is the number of subcircuits 6. Therefore, although switches rated for a peak power of no more than $V_oI_o$ control the MIA, a peak power of $MNV_oI_o$ can be delivered to the load. To further expand the capabilities of MIA based modulators, two or more devices as described above can be connected to a common load, forming a modulator of even greater current capacity. An additional benefit of the MIA design is that every module 4 is essentially at ground potential, which minimizes the voltage insulation requirements and allows the modules 4 to be packaged in a very compact arrangement.

Figure 2:
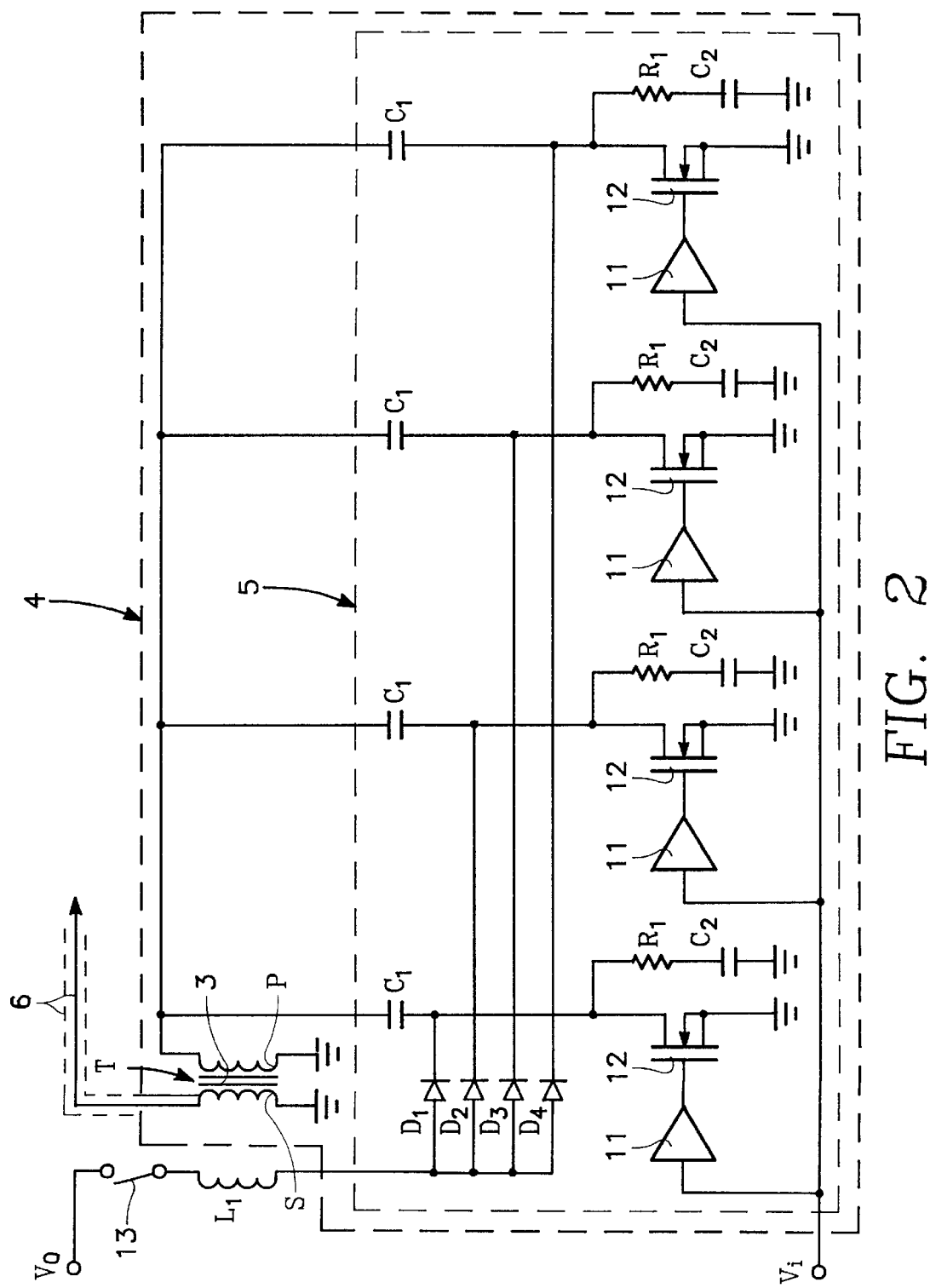
FIG. 2 is a more detailed schematic of a potential embodiment of one of the modules of FIG. 1.

One possible embodiment of the MIA is for a device with twenty-five modules 4 that will deliver 10 kV "square" pulses of 1 $\mu$s duration and 30 ns rise time and fall time to a 100$\Omega$ load. A potential module 4 implementation for this device is illustrated in FIG. 2. The module components are the electrical pulse circuit 5 and inductive adder cell T. The electrical pulse circuit 5 must produce a "square" pulse of 0.4 kV, 0.1 kA and 1 $\mu$s duration with a rise time and fall time of 20 ns. The inductive adder cell T must transmit that pulse to the stalk with a minimum of distortion.

To generate a "square" output pulse, each switch 12 must close to initiate the pulse and then open to terminate the pulse. Each switch 12 in the illustrated embodiment is an IRF840 power MOSFET, as this device is capable of operating in the desired manner. Rapid switching requires a robust signal to the MOSFET gate. Integrated circuit MOSFET gate drivers 11 are used in this implementation, as is common in the field.

To produce a truly flat output pulse, the voltage through each discharge capacitor $C_1$ must remain constant during the pulse. In the illustrated embodiment the voltage drop is limited to 5%, the capacitance per module is $C_1$=4$\mu$F (microfarad). This is realized through the use of four 1 $\mu$F, low inductance, long life, film capacitors. The parallel arrangement reduces the overall equivalent series resistance and inductance of the capacitors, which improves module performance and increases capacitor life. The capacitors $C_1$ are partially discharged during each pulse. In this implementation it is necessary to recharge these capacitors between pulses to produce consistent output pulses. A resonant charge system, indicated by L, in FIG. 2, is used in the illustrated embodiment to generate this pulse. The pulse is distributed to individual capacitors $C_1$ through diodes $D_1$–$D_4$, which provide isolation.

Other configurations of the electrical pulse circuit 5 are possible and could be advantageous for other applications. Referring to FIG. 1, each energy storage device C could be a multiple element pulse forming network (pfn) of impedance $Z_o$. On closure of the switches SW, an approximately square pulse would be delivered to a load of impedance $NZ_o/M$ with a duration characteristic of the pfn where M is the number of subcircuits 6 in each module 4 and N is the number of modules 4. Other approaches that have been investigated are for the combination of C and SW to represent a solid state amplifier circuit. These devices could be designed to operate in either a linear or non-linear mode. Yet another embodiment of the MIA which has been demonstrated is to combine dissimilar electrical pulse circuits on a single MIA. The resultant output pulse, which is the summation of the input pulses, can be quite complex.

Figure 3:
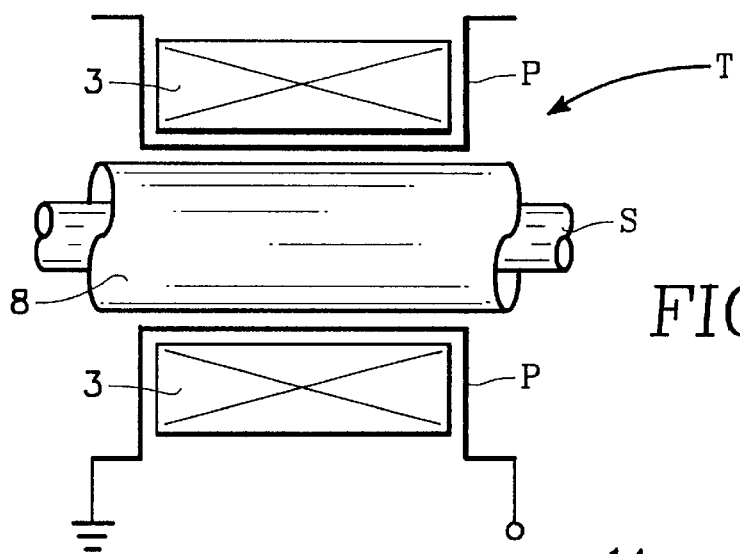
FIG. 3 is a partial cross-sectional view of an inductive adder cell showing the magnetic induction core in cross-section.

FIG. 3 illustrates a preferred configuration for the inductive adder cell T (with the total number of cells (T) being assigned reference 2 in FIG. 1). One of the key elements in controlling the cost and performance of the MIA is the selection of the magnetic core 3 material. There is a minimum cross-sectional area of core material, $A_c$ required to prevent magnetic saturation. This is given by:

$$A_c = V_o \tau / \Delta B,$$

Where $V_o$ is the applied cell primary voltage, $\tau$ is the pulse duration, and $\Delta B$ is the change in magnetic flux density of the core material. For the illustrated arrangement, the cell voltage is $V_o$=400 volts and the pulse duration is $\tau$=1 $\mu$s (microsecond). For a high frequency ferrite, a flux swing of 0.52 Tesla is within the linear regime of the material. Therefore, the minimum cross-section is 7.7 $\times 10^{-4}$ m$^2$(meter).

It is desirable to limit the magnetization current in the primary P in order to maintain high electrical efficiency. This magnetization current, $I_m$, is proportional to the inductance, $L_p$, of the primary P, which is given by:

$$L_p = \frac{\mu}{2\pi} h \log_e \frac{r_o}{r_i}$$

where $\mu$ is the absolute permeability of the core material and $r_o$ is the outer radius of the core. Hence, it is clear that the length of the core, h, should be maximized and the inner core radius, $r_i$, minimized. However, given the minimum core cross-section, $A_c = h(r_o - r_i)$, the other geometric constraints on the magnetic core 3 are; to limit the length of the core, h, such that it is consistent with module dimensions and the inner radius, $r_i$, be large enough to accommodate the stalk. For the illustrated embodiment, this limits the length to h=0.075 m and the radius to $r_i$=2.4$\times 10^{-3}$ m. Applying the minimum cross-section constraint yields $r_o$=1.27$\times 10^{-2}$ m. For the ferrite used in this embodiment, a permeability of $\mu$=3$\times 10^{-3}$ is typical, so the estimated inductance is $L_p$=54 $\mu$H (microhenry). The resultant magnetization current is $I_m \sim 7$ A (amperes) which is less than 10% of the load current, consistent with the goal of 90% efficiency.

An additional motivation for minimizing the magnetization current exists for the topology of the illustrated embodiment. The interruption of this current by the switch opening at the termination of the pulse will produce an inductive voltage, $V_I = L_p dI_m/dt$. This voltage has the potential to damage the switch 12, necessitating a snubber circuit, $R_1 C_2$. The snubber circuit provides an alternate path for the current, $I_m$, during switch opening which reduces $dI_m/dt$ and hence, the inductive voltage, $V_I$, to a safe level. The design of this type of circuit is well known in the art.

As with a traditional pulse transformer, the secondary distributed capacitance, not indicated in the drawing, may limit the pulse rise time. However, the MIA geometry has much lower secondary (stalk) capacitance and very low intrinsic modulator impedance. This allows the secondary distributed capacitance to be charged much more rapidly than in a conventional transformer, thereby achieving higher bandwidth performance.

The stalk inductance, equivalent to a transformer leakage inductance, may also limit the pulse rise time. However, for typical output impedance and stalk inductance, this effect is small. In cases where it is necessary to provide space between two or more inductive adder cells T (for example when the stalk $S_1$, $S_2$ to $S_n$ must be routed from one linear assembly of inductive adder cells T to another), means should be employed to avoid excessive inductance. If possible, a current return should encircle the stalk $S_1$, $S_2$ to $S_n$. When that is not possible, a flux excluder, schematically represented as element 6 in FIG. 2, can be used to minimize the volume of magnetic field associated with the current flow in the stalk, and thereby minimize the stray inductance. This allows the circuit to be folded into a compact geometry. The flux excluder 6 consists of a conductor which fills the space between the stalk and the current return path. When a magnetic field is generated around the stalk, currents will flow in the surface of the conductor such as to exactly cancel the magnetic field that would have existed within the region bounded by the conductor.

The inductive adder cell secondary windings S are connected in series to achieve high voltage output. Since the individual cells, magnetic core 3 and primary winding P, are at near ground potential, electrical insulation 8 between the cell and the secondary is necessary. In the illustrated embodiment, the secondary windings are all formed from a continuous length of solid silicon insulated high voltage cable. In configurations where it would not be possible to use a continuous length of solid insulation cable or where a corona may form in air gaps on the outer surface of the solid insulation, it is possible to replace or augment the solid electrical insulation with a liquid or gaseous insulation.

At the end of each discharge pulse, the magnetic core 3 must be reset, i.e. restored to its original magnetization state, for the illustrated embodiment. The use of reset allows the largest possible change in the magnetic flux density of the core material and therefore results in the smallest possible magnetic core 3. Reset is achieved by reversing the magnetization current in the primary winding P above a critical level that is determined by the core material and geometry. This current may be produced by numerous means including application of a direct current bias to the primary or applying a reset pulse during the period between output pulses.

As previously noted, the energy storage capacitors are partially discharged during each pulse, requiring a charging between output pulses to restore full operating voltage. A fundamental aspect of the illustrated MIA implementation is the pulse that recharges capacitors $C_1$ also automatically resets the magnetic cores 3.

To achieve reset of the magnetic core 3, the peak value of the reset/recharge current, $I_r$, must exceed a minimum current, $I_c$. Additionally, to recharge the capacitors to the same voltage as the prior discharge, the total charge of the reset/recharge pulse must be equal to the total charge of the discharge pulse. For the embodiment illustrated, the combined constraints on current and charge uniquely determine the pulse length and hence, the inductance $L_1$ and the voltage $V_o$. Alternative embodiments of the recharge circuit, such as the command resonant circuit indicated by switch 13, allow for greater circuit flexibility while simultaneously satisfying the constraints.

Figure 4:
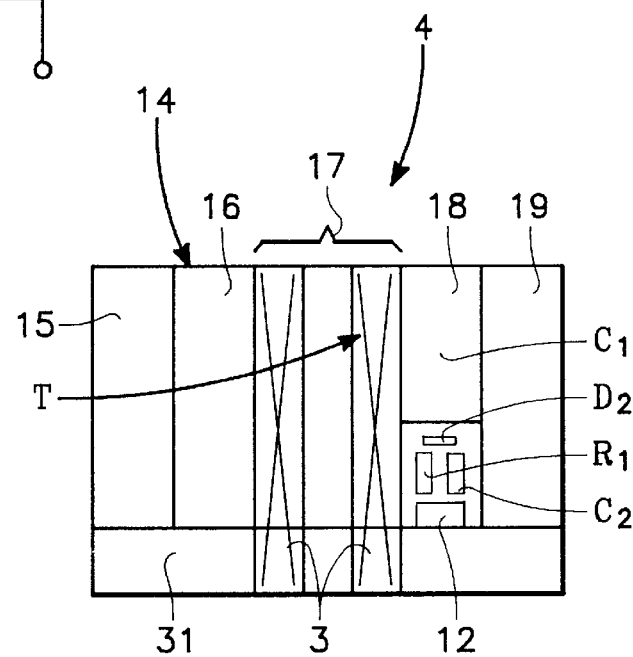
FIG. 4 depicts a possible physical layout scheme for implementing a MIA module.

A possible MIA module 4 component layout 14 is illustrated in FIG. 4. Blocks 15, 16, 18, and 19 represent the arrayed elements of a switch block, only block 18 showing an arrangement of components within a switch block. The numeral 17 designates the location of the induction cell T, and the numeral 31 depicts the location of trigger conditioning components such as the aforementioned array of gate driver integrated circuits 11. Such trigger conditioning components would be selected as a matter of design choice, and details of appropriate components would be well within the knowledge of a person of ordinary skill in the art without the need to unnecessarily complicate this specification. The switches 12 and capacitors C1 are placed in close proximity to the induction cell T to minimize stray inductance and/or capacitance which would increase losses. A printed circuit board is used to allow simple and reliable assembly of the module circuit. The heat transfer surfaces of all switches 12 fall in the same plane to allow a common cold plate (not shown) to be used for heat absorption. All low power triggering components 31 are grouped together, away from the high voltage elements to enhance noise immunity.

Competing Technologies

Arrays of solid-state switching elements, combined in series (to overcome the voltage limitations of single solid-state devices) and parallel (to increase current capabilities) have been investigated as a means of generating high voltage pulses. For the pulse rise times of <50 ns, the MOSFET is the best switching element currently available. The successful development of a 6 kV and 700 A array was reported over ten years ago (Santamaria, G. T. and Ness, R. M., "High Power Switching Using Power FET Arrays", Proc. of the $6^{th}$ IEEE Pulsed Power Conf., Arlington, Va., June 1987, pg 161). More recently, work at Lawrence Livermore National Laboratory (LLNL) has extended these parameters to 5 kV, 3 kA, 40 ns rise time and 200 kHz pulse repetition frequency (Kirbie, H. C. et al., "Evolution of High-Repetition-Rate Induction Accelerators Through Advancements in Switching", Canada, August 1992, pg 595; Kirbie, H. C. et al., "A FET-Switched Induction Accelerator Cell", Proc. of the $9^{th}$ IEEE Pulsed Power Conf., Albuquerque, N. Mex., June 1993).

However, these pulse modulator design approaches have two substantial limitations. First, it is necessary to carefully distribute the voltage between series switches in the on, off, and transient switching states. Uneven division of the voltage can result in device failure which further stresses the other elements in series. Such a positive feedback mechanism can lead to the failure of the entire modulator. To prevent such failures, usually both resistive and capacitive voltage dividers are placed in parallel with the FETs in an attempt to provide wide bandwidth voltage division between stages. Additionally, the switches are usually operated at substantially less than their rated capability to compensate for errors in voltage distribution.

The second difficulty encountered in stacking solid-state switches is in applying the trigger pulse to the elements at elevated voltage. Triggering must be uniform or voltage division between stages will be distorted. Usually, either a high voltage transformer or fiber optic link is used to apply the trigger to the high side stages. Transformer coupling is straight forward but introduces numerous fault modes into the system. Fiber optic coupling is safer, but, because power switching FETs require robust triggers, it necessitates the inclusion of floating power supplies at each switch voltage, increasing the cost and complexity.

Inductive adder technology has been developed for use in very high current electron accelerators by Pulse Sciences, Inc. and Sandia National Laboratories (Smith, I.D., "Pulsed Power in the United States", Proc. of the 8$^{th}$ IEEE Pulsed Power Conf., San Diego, Calif., June 1991, pg 15, Bayless, J. R. and Miller, R. B., "Induction Adder for Radiographic Applications", Proc. of the 1989 Flash Radiography Topical Conference, Welches, Oreg. August 1989; and Smith, I. D. et al., "Design of a Repetitive +30 MV, 4 MJ, 9 ns ICF Reactor Driver", Proc. of the 7$^{th}$ IEEE Pulsed Power Conf., Monterey, Calif., June 1989, pg 36.). However, these devices have not used solid-state switches. The voltage and current of each module greatly exceed the capabilities of solid-state devices. Further, the recharging of the energy storage capacitors and the resetting of the induction cores are provided by separate circuits.

Use of MIAs in a Specific Application

The MIA technology may be employed for use in air pollution control. In this case, air containing small concentrations (1–5000 ppm) of contaminants such as $SO_2$, $NO_2$, NO, and/or volatile organic compounds (benzene, toluene, xylene, etc.) would be passed through a plasma discharge reactor which would be driven by a MIA. The unique advantages of the MIA in this application are its ability to deliver short (in the range 50 ns-10 $\mu$s, about 100 ns typical) pulses with fast rise times (<20 ns) at high pulse repetition frequencies (>1 kHz) and power levels (kilowatts) with extremely long lifetimes (>$10^{11}$ pulses). The MIA also offers high electrical efficiency (about 90%), low weight, small size, and low cost. No other pulse modulator technology offers this combination of attributes. Spark gap switched pulse generators offer limited repetition rates and lifetimes. Thyratron switched generators are expensive to operate, since the thyratron must be replaced frequently. Magnetic pulse compressors offer poor efficiency and high cost. Other solid state pulse modulator configurations cannot operate reliably at high voltage without requiring large safety margins and higher costs.

Figure 5:
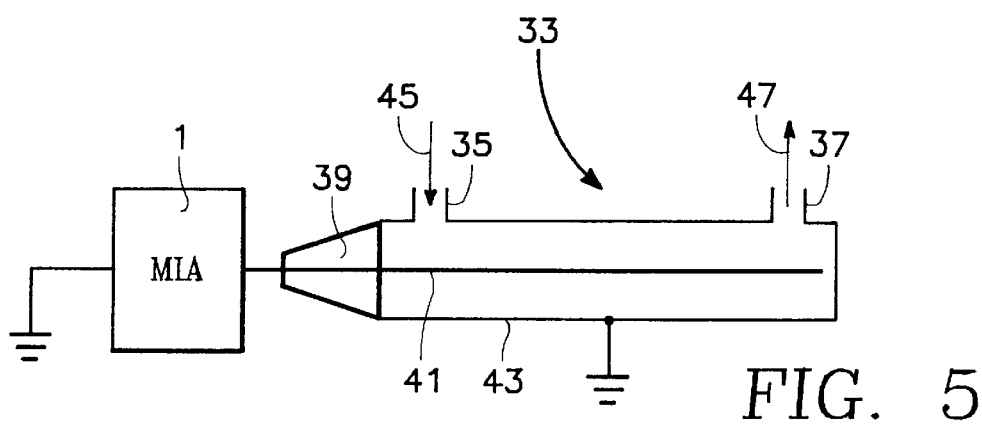
FIG. 5 is a schematic representation of a pulsed corona reactor employing a MIA driver.

As an example, FIG. 5 shows the MIA 1 connected to a pulsed corona reactor 33 for use in the destruction of contaminants in air streams. This type of reactor consists of one or more grounded metal tubes 43 with a small diameter anode 41 running along the axis of each tube 43. Contaminated gas 45 enters an inlet port 35 at one end of the tube assembly 43 and the decontaminated gas 47 exits through an output port 37 at the other end. Positive (or negative) high voltage (10–200 kV) pulses of short duration are delivered to the anode(s) 41 through the high voltage bushing(s) 39. This results in the formation of numerous corona discharge streamers (channels of ionization) which rapidly cross the distance between the anode 41 and the grounded tube 43. The energetic electrons produced in the discharge interact with the air to form excited radicals which then react with the contaminants to oxidize or reduce them to non-toxic compounds.

What is claimed is:

1. A pulse modulator formed of modules, each module of said modules comprising:

an inductive adder cell, said inductive adder cell having a magnetic induction core, a single turn primary surrounding said core and a single turn secondary surrounding said core, said secondary comprising a secondary stalk and a current return, said secondary stalk being insulated to provide electrical isolation between said primary and said secondary; and an electrical output pulse circuit, said electrical output pulse circuit having a control valve comprising at least one semiconductor device, said electrical output pulse circuit being coupled to deliver an electrical output pulse to said primary; and said pulse modulator being formed by the joining of each module of said modules in a series array by an inductive adder electrical interconnect arrangement, said series array having at least a first module and a subsequent module, said inductive adder electrical interconnect arrangement connecting said secondary of said first module in series with said secondary of said subsequent module, said inductive adder electrical interconnect arrangement having two ends, said pulse modulator having an electrical output, said electrical output being generated between said two ends.

2. The pulse modulator as defined in claim 1 wherein:
   said electrical output pulse circuit of each said module of said modules are of identical construction and performance.

3. The pulse modulator as defined in claim 1 wherein:
   said electrical output pulse circuit of at least one said module of said modules is different in construction or performance resulting in the generation of complex waveforms at said output.

4. The pulse modulator as defined in claim 1 wherein:
   said electrical output pulse circuit being controlled by a parallel array of semiconductor devices.

5. The pulse modulator as defined in claim 1 wherein:
   said electrical output pulse circuit includes a storage capacitor and a semiconductor switch, said electrical output pulse being generated upon closing of said switch and discharging of said storage capacitor through said primary.

6. The pulse modulator as defined in claim 1 wherein:
   said electrical output pulse circuit includes a pulse forming network and a semiconductor switch, said electrical output pulse being generated upon closing of said switch and discharging of said electrical output pulse through said primary.

7. The pulse modulator as defined in claim 1 wherein:
   said electrical output pulse circuit includes a storage capacitor and a semiconductor switch, said electrical output pulse being a square pulse which is initiated upon closing of said switch which causes said storage capacitor to discharge through said primary, said electrical pulse is terminated by opening said switch before said storage capacitor is substantially discharged.

8. The pulse modulator as defined in claim 1 wherein:
   said electrical output pulse circuit comprises an electrical amplifier circuit.

9. The pulse modulator as defined in claim 8 wherein:
   said electrical amplifier circuit comprises a linear amplifier circuit.

10. The pulse modulator as defined in claim 1 wherein:

the electrical charge removed from said electrical output pulse circuit during each said electrical output pulse is replaced, herein known as recharging, prior to the generation of subsequent electrical output pulses, thereby allowing an indefinite number of said electrical output pulses to be generated by said modulator.

11. The pulse modulator as defined in claim 10 including:

a second electrical pulse circuit, herein known as a recharge circuit, which recharges said electrical output pulse circuit.

12. The pulse modulator as defined in claim 1 wherein:

said magnetic induction core being restored to its initial magnetization state, herein known as reset, prior to the application of a subsequent electrical output pulse.

13. The pulse modulator as defined in claim 12 including:

a second electrical pulse circuit, herein known as a reset circuit, which resets said magnetic induction core.

14. The pulse modulator as defined in claim 13 wherein:

said reset circuit being direct current.

15. The pulse modulator as defined in claim 10 wherein:

said electrical charge used to recharge said electrical output pulse circuit is also used to reset said magnetic induction core.

16. The pulse modulator as defined in claim 15 including:

a second electrical pulse circuit, herein known as a recharge/reset circuit, which functions to both reset said magnetic induction core and recharge said electrical output pulse circuit.

17. The pulse modulator as defined in claim 16 wherein:

said recharge/reset circuit is a passive resonant circuit.

18. The pulse modulator as defined in claim 16 wherein:

said recharge/reset circuit is a command resonant circuit capable of adjusting the duration of the electrical pulse which will reset said magnetic induction core and recharge said electrical output pulse circuit thereby increasing the range of parameters over which both functions of said reset and said recharge can be achieved.

19. The pulse modulator as defined in claim 1 wherein:

electrical means being located along said inductive adder electrical interconnect arrangement to minimize the inductance associated with sections of said secondary which are not enclosed by said magnetic induction core.

20. The pulse modulator as defined in claim 19 wherein:

said electrical means comprising current return conductors which enclose a lead of said secondary and provide the sole return path for the current carried in said lead.

21. The pulse modulator as defined in claim 19 wherein:

said electrical means comprising electrically conductive structures known as flux excluders which enclose a lead of said secondary but do not provide a return path for the current carried in said lead.

22. The pulse modulator as defined in claim 1 wherein:

said secondary stalk insulation comprising a solid dielectric.

23. The pulse modulator as defined in claim 1 wherein:

said secondary stalk insulation comprising a liquid dielectric.

24. A pulse modulator comprising a parallel combination of at least two of said modulators as claimed in claim 1.

25. A plasma discharge reactor powered by the modulator as claimed in claim 1.

* * * * *